US006795043B2

(12) United States Patent
Shibata

(10) Patent No.: US 6,795,043 B2
(45) Date of Patent: Sep. 21, 2004

(54) CLOCK GENERATION CIRCUIT HAVING PLL CIRCUIT

(75) Inventor: Tatsuo Shibata, Toky (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 256 days.

(21) Appl. No.: 09/822,263

(22) Filed: Apr. 2, 2001

(65) Prior Publication Data

US 2002/0036598 A1 Mar. 28, 2002

(30) Foreign Application Priority Data

Sep. 26, 2000 (JP) .................................... P2000-291706

(51) Int. Cl.[7] ............................ G09G 1/08; H03L 7/00; H04N 5/655

(52) U.S. Cl. ............................ 345/13; 345/11; 345/12; 348/540; 348/541; 348/829

(58) Field of Search .............................. 345/10, 11, 12, 345/13, 18; 348/500, 516, 521, 540, 541, 776, 805, 829

(56) References Cited

U.S. PATENT DOCUMENTS 4,490,741 A * 12/1984 Hornback .................. 348/550
5,043,813 A * 8/1991 Christopher ................ 348/540
5,181,116 A * 1/1993 Nakagaki et al. ........... 348/540
5,223,931 A * 6/1993 Fernsler et al. ............ 348/540
5,247,229 A * 9/1993 Ngo et al. .................. 348/540
5,619,276 A * 4/1997 Christopher et al. ........ 348/541
6,285,402 B1 * 9/2001 Miyazaki et al. ........... 348/540

FOREIGN PATENT DOCUMENTS

JP 2000172213 6/2000
TW 86100488 1/1997

OTHER PUBLICATIONS

NEC Data Sheet (Provisional) "Synchronizing Signal Processing LSI for Multisync Display" PD61882.

* cited by examiner

*Primary Examiner*—Bipin Shalwala
*Assistant Examiner*—David L. Lewis
(74) *Attorney, Agent, or Firm*—Birch, Stewart, Kolasch & Birch, LLP.

(57) ABSTRACT

A first PLL circuit (100) receives a flyback pulse (VFB) as a reference signal and outputs a clock signal (CLK1), and a delay circuit (200) outputs a flyback delay signal (VFBD) having a predetermined delay time corresponding to the amount of horizontal movement on a screen. A second PLL circuit (300) receives a horizontal synchronizing signal (VHSYNC) and the flyback delay signal (VFBD) as a reference signal and a compared signal, respectively, and generates a horizontal drive pulse (VHD). A deflection yoke (12) receives the horizontal drive pulse (VHD) and generates a flyback pulse, and a step-down transformer circuit (16) outputs the flyback pulse (VFB) whose voltage is lowered. With this constitution, it becomes possible to generate a stable horizontal drive pulse which causes no jitter on the screen when a PIN balance correction, a KEY balance correction and a horizontal position adjustment of a CRT are performed by digital processing.

16 Claims, 6 Drawing Sheets

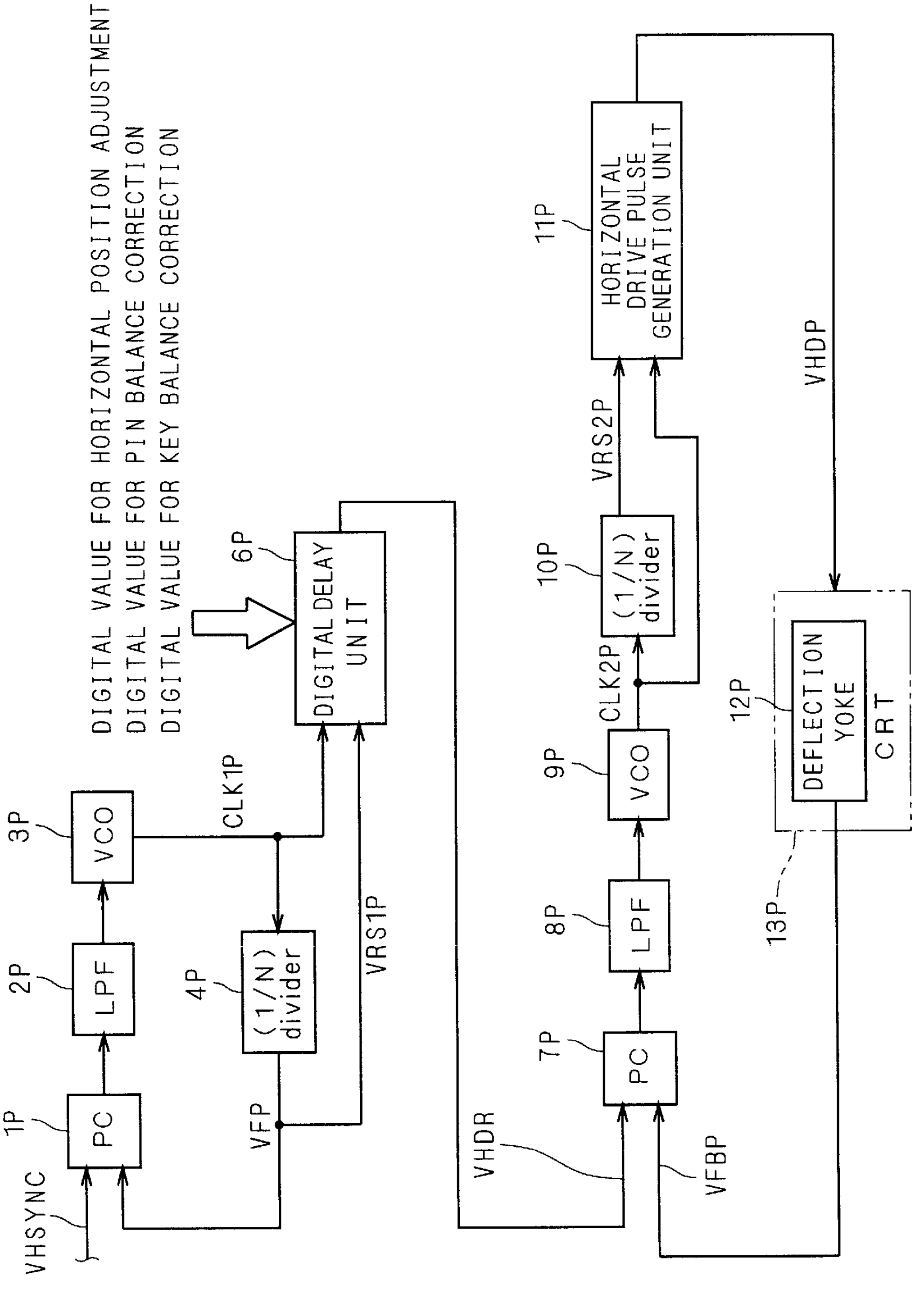
FIG. 6 <PRIOR ART>

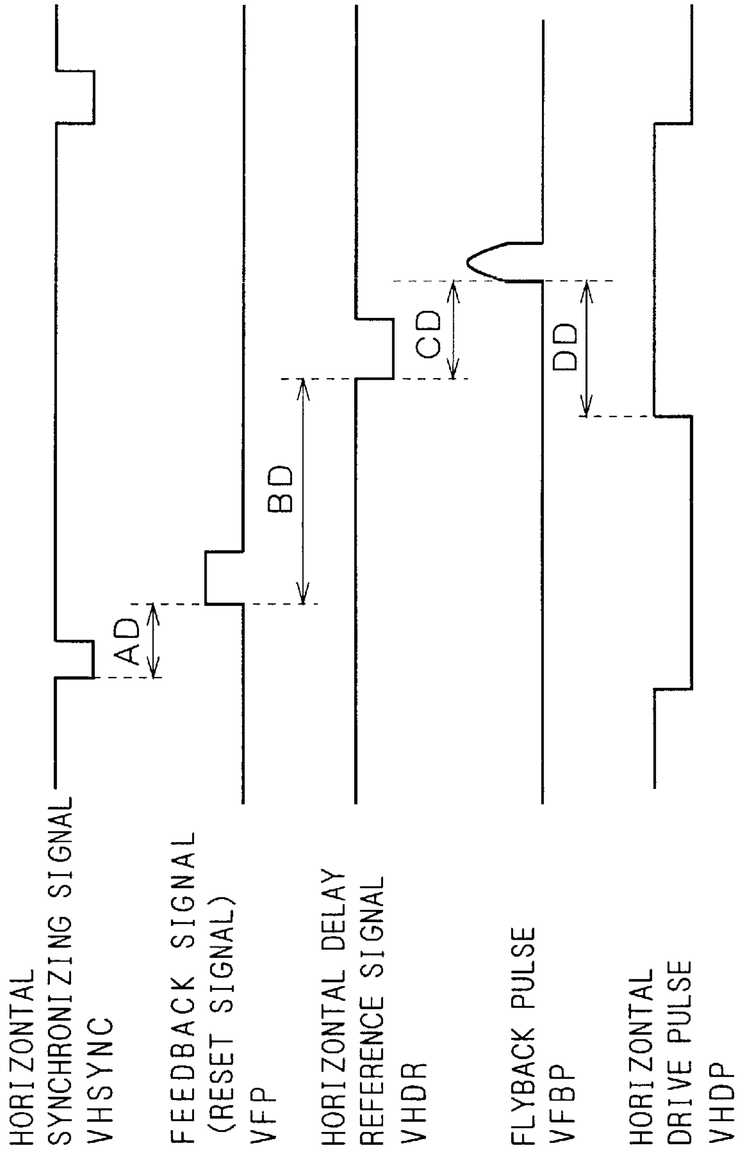
FIG. 7A <PRIOR ART>
FIG. 7B <PRIOR ART>
FIG. 7C <PRIOR ART>
FIG. 7D <PRIOR ART>
FIG. 7E <PRIOR ART>

CLOCK GENERATION CIRCUIT HAVING PLL CIRCUIT

BACKGROUND OF THE INVENTION

1. Field of the Invention

The present invention relates to a clock generation circuit mounted on an image display device such as a display monitor or a television receiver.

2. Description of the Background Art

In a CRT (cathode ray tube), usually, there is a distortion in an image, depending on the overall shape of a Braun tube (cathode ray tube). Then, the distortion of the image is corrected by generating a distortion correction waveform. Further, because of variation in characteristics of parts, a horizontal position adjustment of screen is performed for each CRT in accordance with the characteristics of CRTs. The image distortion correction and the horizontal position adjustment of screen have been performed by using an analog circuit, but a desired operation with high accuracy cannot be necessarily obtained. A method to solve this situation is an image distortion correction and a horizontal position adjustment of screen using a digital signal.

FIG. 6 is a block diagram showing an overall constitution of a clock generation circuit in the background art which is proposed to perform the horizontal position adjustment and the image distortion correction using a digital signal. The clock generation circuit of FIG. 6 comprises two PLL circuits for generating clocks locked with received reference signals. This clock generation circuit is disclosed in, e.g., Japanese Patent Application Laid Open Gazette No. 2000-172213.

In FIG. 6, a first PLL circuit is constituted of a first phase comparator 1P (hereinafter, referred to as PC 1P), a first low-pass filter 2P (hereinafter, referred to as LPF 2P), a first voltage controlled oscillator 3P (hereinafter, referred to as VCO 3P) and a first (1/N) variable divider 4P (hereinafter, referred to as (1/N) divider 4P).

On the other hand, a second PLL circuit is constituted of a second phase comparator 7P (hereinafter, referred to as PC 7P), a second low-pass filter 8P (hereinafter, referred to as LPF 8P), a second voltage controlled oscillator 9P (hereinafter, referred to as VCO 9P), a second (1/N) variable divider 10P (hereinafter, referred to as (1/N) divider 10P), a horizontal drive pulse generation unit 11P and a deflection yoke 12P which a CRT 13P has.

Further, a digital delay unit 6P plays an important part in the above-discussed horizontal position adjustment of screen and the image distortion correction.

Next, an operation of the clock generation circuit having the above constitution will be discussed.

First, the PC 1P receives a horizontal synchronizing signal VHSYNC as a reference signal and compares the phases of the horizontal synchronizing signal VHSYNC and the other input signal VFP. The LPF 2P on the next stage smoothes an output signal from the PC 1P to generate a control voltage and outputs the control voltage to a control voltage receiving terminal of the VCO 3P. In accordance with the control voltage, the VCO 3P outputs a first clock signal CLK1P (hereinafter, referred to as clock CLK1P). The (1/N) divider 4P divides the frequency of the clock CLK1P into (1/N) (N is any positive integer) and transmits the output signal to the PC 1P as a feedback signal VFP. As a result, the phase of the feedback signal VFP is compared with the phase of the horizontal synchronizing signal VHSYNC by the PC 1P. Thus, the first PLL circuit works with the horizontal synchronizing signal VHSYNC used as the reference signal.

Next, the clock CLK1P and a first reset signal VRS1P (hereinafter, referred to as reset signal VRS1P) which corresponds to the feedback signal VFP are transmitted from an output end of the first PLL circuit to an input end of the digital delay unit 6P. The digital delay unit 6P starts a count operation of the clock CLK1P in response to the input timing of the reset signal VRS1P and outputs a horizontal delay reference signal VHDR which is delayed in phase from the reset signal VRS1P at the timing of coincidence between the count value and a digital value (any one of a digital value for horizontal position adjustment, a digital value for PIN balance correction and a digital value for KEY balance correction) which is set in the digital delay unit 6P before the reset signal VRS1P is inputted.

The horizontal delay reference signal VHDR is inputted to one input end of the PC 7P as a reference signal of the second PLL circuit. The PC 7P compares the phases of the horizontal delay reference signal VHDR and a signal VFBP received by the other input end and an output signal giving the phase difference is smoothed by the LPF 8P to become a control voltage of the VCO 9P. The VCO 9P performs an oscillation operation in accordance with the control voltage to output a second clock signal CLK2P (hereinafter, referred to as clock CLK2P). The (1/N) divider 10P divides the frequency of the clock CLK2P into 1/N (N is any positive integer) and transmits an output signal to the horizontal drive pulse generation unit 11P as a second reset signal VRS2P (hereinafter, referred to as reset signal VRS2P). The horizontal drive pulse generation unit 11P generates a horizontal drive pulse VHDP on the basis of the clock CLK2P and the reset signal VRS2P, to drive the deflection yoke 12P. With this driving operation, in a horizontal output circuit (not shown) which the deflection yoke 12P has, a flyback pulse of high energy is generated in a deflection coil (not shown) connected to a primary high-voltage winding of a flyback transformer (not shown) after a predetermined delay time passes from the input timing of the horizontal drive pulse VHDP. A step-down transformer circuit (not shown) having an input end connected to the one end of the deflection coil of the deflection yoke 12P lowers the voltage of the flyback pulse and outputs the voltage-lowered flyback pulse VFBP (hereinafter, referred to simply as flyback pulse VFBP) to the PC 7P. As a result, the PC 7P compares the phases of the horizontal delay reference signal VHDR and the flyback pulse VFBP. Thus, the second PLL circuit works to generate the horizontal drive pulse VHDP with the horizontal delay reference signal VHDR used as the reference signal.

FIGS. 7A to 7E are timing charts of the signals at the time when the clock generation circuit of FIG. 6 is brought into a steady state by the locking operation of the first and second PLL circuits.

Specifically, FIG. 7A shows the horizontal synchronizing signal VHSYNC which corresponds to the reference signal of the first PLL circuit, and the horizontal synchronizing signal VHSYNC is inputted to the PC 1P. FIG. 7B shows the feedback signal VFP or the reset signal VRS1P of the first PLL circuit, and the feedback signal VFP is inputted to the PC 1P and outputted to the digital delay unit 6P at the same time. The first PLL circuit in the steady state keeps a condition where the phase difference between the horizontal synchronizing signal VHSYNC of FIG. 7A and the feedback signal VFP of FIG. 7B is a time AD.

On the other hand, FIG. 7C shows the horizontal delay reference signal VHDR which corresponds to the reference signal of the second PLL circuit, and the horizontal delay reference signal VHDR is generated by the digital delay unit 6P. A time period from an input timing (rise timing) of the reset signal VRS1P of FIG. 7B to the output timing (fall timing) of the horizontal delay reference signal VHDR of FIG. 7C is a delay time BD produced by the digital delay unit 6P. Specifically, the digital delay unit 6P generates the horizontal delay reference signal VHDR having a predetermined delay time BD in accordance with any one of the digital value for horizontal position adjustment, the digital value for PIN balance correction and the digital value for KEY balance correction which is set in the digital delay unit 6P, and the image display device performs the horizontal position adjustment of screen and/or the image distortion correction by using the delay time BD.

FIG. 7D shows the flyback pulse VFBP, and the flyback pulse VFBP is inputted to the PC 7P along with the horizontal delay reference signal VHDR of FIG. 7C. In a locked state, the second PLL circuit keeps a condition where the phase difference between the horizontal delay reference signal VHDR and the flyback pulse VFBP is a predetermined time CD shown in FIG. 7D.

FIG. 7E shows the horizontal drive pulse VHDP, and the horizontal drive pulse VHDP is a pulse whose duty ratio is almost 1:1 in one horizontal scanning period. As shown in FIG. 7E, there is a delay time DD between an edge (herein, rising edge) of the horizontal drive pulse VHDP and an edge (herein, rising edge) of the flyback pulse VFBP in the locked state.

The background-art clock generation circuit of FIG. 6 uses the output signal VHDR from the digital delay unit 6P which is driven on the basis of the clock CLK1P outputted from the first PLL circuit as the reference signal inputted to the PC 7P of the second PLL circuit. For this reason, in the second PLL circuit which operates while generating the clock CLK2P, the reference signal of the second PLL circuit always has some jitter.

Moreover, every time when the horizontal position adjustment, the PIN balance correction or the KEY balance correction is performed, the phase of the horizontal delay reference signal VHDR generated by the digital delay unit 6P largely varies.

Further, the flyback pulse VFBP serving as the feedback signal of the second PLL circuit is a signal which is likely to vary, depending on various factors including the type of used monitor, resolution and ambient temperature. In other words, the delay time DD in the locked state varies with the ambient temperature and the like.

Thus, since the phases of the two signals (the horizontal delay reference signal VHDR and the flyback pulse VFBP) inputted to the PC 7P of the second PLL circuit largely vary, the second PLL circuit has a large load, being likely to become unstable. Therefore, some jitter is generated in the clock CLK2P outputted from the VCO 9P of the second PLL circuit and as a result, the phase of the horizontal drive pulse VHDP varies and as a result, some jitter is disadvantageously likely to appear on the screen of the CRT 13P.

SUMMARY OF THE INVENTION

The present invention is directed to a clock generation circuit. According to a first aspect of the present invention, the clock generation circuit comprises: an input signal line comprising one end connected to a flyback pulse output terminal which an external deflection yoke has; and a phase locked loop circuit comprising an input terminal connected to the other end of the input signal line, and in the clock generation circuit of the first aspect, the phase locked loop circuit comprises a phase comparator comprising a first input terminal which corresponds to the input terminal and a second input terminal receiving a feedback signal; a low-pass filter comprising an input terminal connected to an output terminal of the phase comparator; a voltage controlled oscillator comprising a control voltage terminal connected to an output terminal of the low-pass filter; and a (1/N) divider (N is a positive integer) comprising an input terminal connected to an output terminal of the voltage controlled oscillator and an output terminal connected to the second input terminal of the phase comparator.

According to a second aspect of the present invention, the clock generation circuit of the first aspect further comprises: a delay circuit comprising a first input terminal connected to the other end of the input signal line and a second input terminal connected to the output terminal of the voltage controlled oscillator, the delay circuit detecting an edge of a flyback pulse and outputting a flyback delay signal which is delayed from the edge by a predetermined delay time, and in the clock generation circuit of the second aspect, the predetermined delay time corresponds to the amount of horizontal movement on a screen of a cathode ray tube comprising the deflection yoke.

According to a third aspect of the present invention, in the clock generation circuit of the second aspect, the phase locked loop circuit, the phase comparator, the low-pass filter, the voltage controlled oscillator and the (1/N) divider are defined as a first phase locked loop circuit, a first phase comparator, a first low-pass filter, a first voltage controlled oscillator and a first (1/N) divider, and the clock generation circuit of the third aspect further comprises a second phase locked loop circuit comprising a first input terminal receiving a horizontal synchronizing signal, a second input terminal connected to an output terminal of the delay circuit and an output terminal connected to a horizontal drive pulse receiving terminal which the deflection yoke has, and in the clock generation circuit of the third aspect, the second phase locked loop circuit comprises a second phase comparator comprising the first input terminal and the second input terminal of the second phase locked loop circuit; a second low-pass filter comprising an input terminal connected to an output terminal of the second phase comparator; a second voltage controlled oscillator comprising a control voltage terminal connected to an output terminal of the second low-pass filter; a second (1/N) divider comprising an input terminal connected to an output terminal of the second voltage controlled oscillator; and a horizontal drive pulse generation unit comprising a first input terminal connected to an output terminal of the second (1/N) divider and a second input terminal connected to the output terminal of the second voltage controlled oscillator, the horizontal drive pulse generation unit generating a horizontal drive pulse and outputting the horizontal drive pulse from the output terminal of the second phase locked loop circuit.

According to a fourth aspect of the present invention, in the clock generation circuit of any one of the first to third aspects, the input signal line comprises a step-down transformer circuit.

The present invention is also directed to an image display device. According to a fifth aspect of the present invention, the image display device comprises: the clock generation circuit of any one of the first to fourth aspects; and a cathode ray tube, and in the image display device of the fifth aspect, the cathode ray tube comprises a deflection yoke comprising a flyback pulse output terminal connected to the one end of the input signal line and a horizontal drive pulse receiving terminal connected to the output terminal of the second phase locked loop circuit.

The present invention is directed to a clock generation circuit again. According to a sixth aspect of the present invention, the clock generation circuit comprises: input means for transmitting a flyback pulse supplied from an external deflection yoke; and first phase locked loop means for receiving the flyback pulse from the input means as a first reference signal, and for generating a first clock signal in synchronization with the flyback pulse.

According to a seventh aspect of the present invention, the clock generation circuit of the sixth aspect further comprises delay means for receiving the flyback pulse and the first clock signal from the input means and the first phase locked loop means, respectively, and for detecting an edge of the flyback pulse and generating a flyback delay signal which is delayed from the edge by a predetermined delay time, and in the clock generation circuit of the seventh aspect, the predetermined delay time corresponds to the amount of horizontal movement on a screen of a cathode ray tube comprising the deflection yoke.

According to an eighth aspect of the present invention, the clock generation circuit of the seventh aspect further comprises second phase locked loop means for receiving a horizontal synchronizing signal and the flyback delay signal as a second reference signal and a compared signal, respectively, and for generating a horizontal drive pulse, and in the clock generation circuit of the eighth aspect, the second phase locked loop means comprises phase comparator means for comparing a phase of the horizontal synchronizing signal and a phase of the flyback delay signal to generate a phase difference signal giving a phase difference between the horizontal synchronizing signal and the flyback delay signal; low-pass filter means for smoothing the phase difference signal to output a smoothed signal; voltage controlled oscillator means for receiving the smoothed signal as a control signal, and for performing an oscillation operation in accordance with the control signal to generate a second clock signal; (1/N) divider means for dividing a frequency of the second clock signal to generate a reset signal whose frequency is 1/N of the frequency of the second clock signal; and horizontal drive pulse generation means for generating the horizontal drive pulse for the deflection yoke on the basis of the second clock signal and the reset signal.

According to a ninth aspect of the present invention, in the clock generation circuit of the eighth aspect, the input signal means comprises step-down transformer means for lowering a voltage of a high-voltage flyback pulse outputted from the deflection yoke to generate the flyback pulse.

The present invention is directed to an image display device again. According to a tenth aspect of the present invention, the image display device comprises: the clock generation circuit of the ninth aspect; and a cathode ray tube, and in the image display device of the tenth aspect, the cathode ray tube comprises a deflection yoke comprising a flyback pulse output terminal connected to an input terminal of the step-down transformer means and a horizontal drive pulse receiving terminal connected to an output terminal of the horizontal drive pulse generation means.

The present invention has the above constitution, and therefore produces the following effects.

In the clock generation circuit of the first aspect of the present invention, since the PLL circuit receives the flyback pulse and the feedback signal which is obtained by dividing a clock outputted from the voltage controlled oscillator as the reference signal and the compared signal, respectively, to perform a locking operation, the PLL circuit absorbs more quickly a phase fluctuation of the flyback pulse caused by various factors such as ambient temperature and can therefore generate a stable clock.

In the clock generation circuit of the second aspect of the present invention, it is possible to generate the flyback delay signal having a predetermined delay signal needed for the horizontal position adjustment, the PIN balance correction or the KEY balance correction on the basis of the flyback pulse and the clock outputted from the PLL circuit.

In the clock generation circuit of the third aspect and the image display device of the fifth aspect of the present invention, since the first PLL circuit can quickly absorb the phase fluctuation of the flyback pulse to generate a stable clock and moreover the second PLL circuit receives the stable horizontal synchronizing signal with no jitter as its reference signal, the second PLL circuit can operate more stably. Thus, as the result of the above two factors, the present invention can exert effects of generating the stable horizontal drive pulse with no jitter and effectively preventing the jitter from appearing on the screen.

The clock generation circuit of the fourth aspect of the present invention can produce an effect of protecting the phase comparator from the high-voltage flyback pulse when the phase comparator having the input terminal connected to the other end of the input signal line can not directly receive the high-voltage flyback pulse in terms of its characteristics.

An object of the present invention is to provide a clock generation circuit capable of generating a stable horizontal drive pulse which causes no jitter on a screen and an image display device on which the clock generation circuit is mounted.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a block diagram showing a constitution of a clock generation circuit in the background art; and FIGS. 7A to 7E are timing charts showing an operation of the clock generation circuit in the background art.

DESCRIPTION OF THE PREFERRED EMBODIMENTS

The characteristic features of a clock generation circuit of the preferred embodiment of the present invention are summarized as follows. In the following discussion, a phase locked loop circuit is referred to simply as "a PLL circuit".

(1) First, an ante-stage first PLL circuit uses a flyback pulse as its reference signal. Then, a first phase comparator of the first PLL circuit receives the flyback pulse and a feedback signal which is obtained by dividing a first clock signal outputted from a first voltage controlled oscillator and compares the phases of these signals. As a result, the first PLL circuit can output the first clock signal in synchronization with the flyback pulse in the locked state.

This constitution allows the first PLL circuit to quickly absorb the phase fluctuation of the flyback pulse caused by the ambient temperature, etc.

(2) Next, a post-stage second PLL circuit for generating a horizontal drive pulse uses a horizontal synchronizing signal as its reference signal. Then, a second phase comparator of the second PLL circuit receives the horizontal synchronizing signal and a flyback delay signal having a predetermined delay time which is generated by a delay circuit driven on the basis of the flyback pulse and the first clock signal outputted from the first PLL circuit, and compares the phases of the horizontal synchronizing signal and the flyback delay signal.

In this constitution, since the reference signal among two signals inputted to the second phase comparator is the stable horizontal synchronizing signal, the load on the second PLL circuit is reduced and therefore it is possible to sufficiently suppress the phase fluctuation of the second clock signal outputted from the second voltage controlled oscillator.

The above two factors (1) and (2) allow generation of the stable horizontal drive pulse and prevent any jitter from appearing on a screen.

The preferred embodiment of the present invention will be discussed more specifically below, referring to figures.

(The First Preferred Embodiment)

Figure 1:
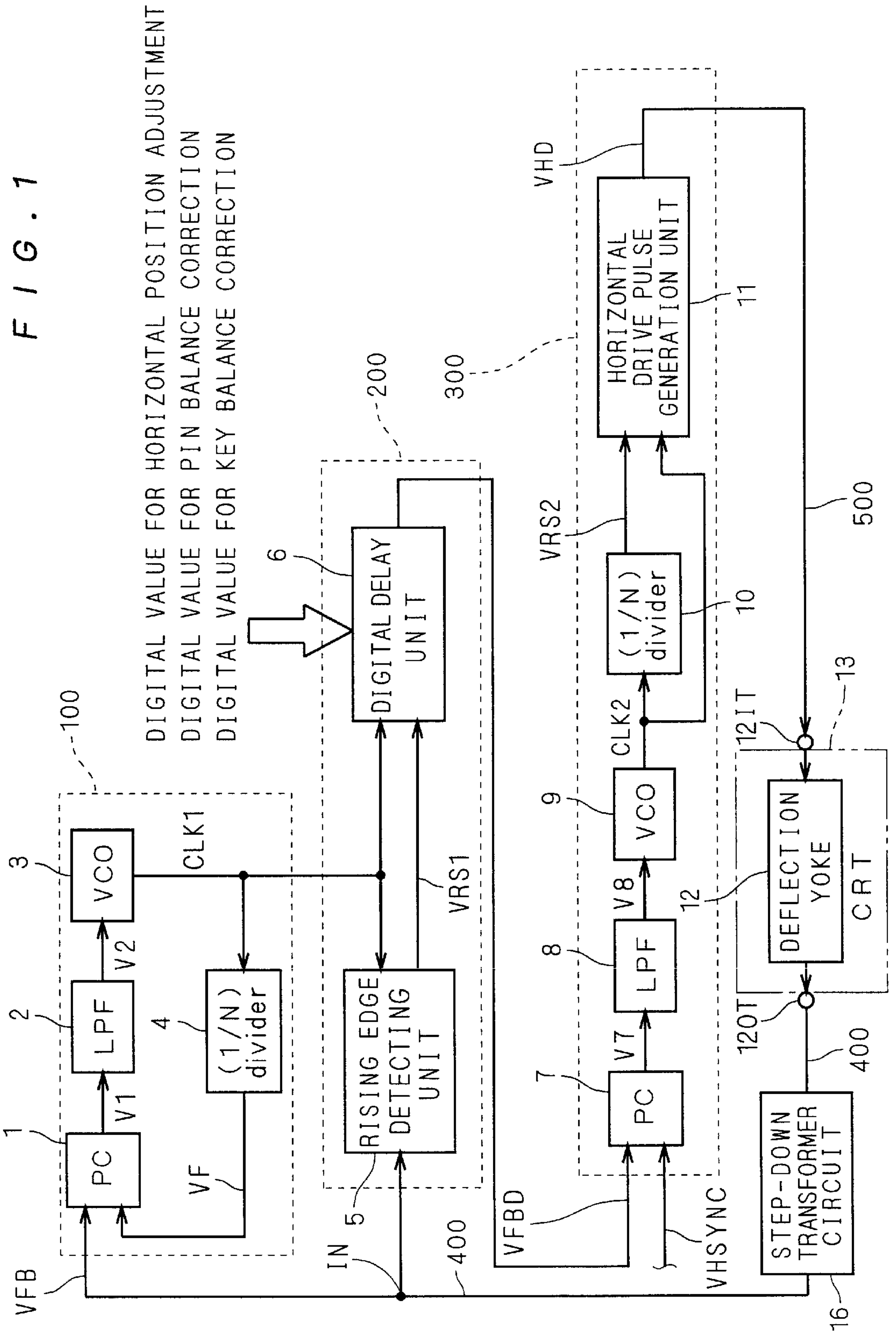
FIG. 1 is a block diagram showing a clock generation circuit and a cathode ray tube included in part of an image display device in accordance with a first preferred embodiment of the present invention.

FIG. 1 is a block diagram showing a clock generation circuit and a CRT (cathode ray tube) 13 included in an image display device in accordance with the first preferred embodiment of the present invention. As shown in FIG. 1, the clock generation circuit is broadly divided into an input signal line 400, a first PLL circuit 100, a delay circuit 200, a second PLL circuit 300 and an output signal line 500. Further, it can be considered that the circuits of FIG. 1 constitute one PLL (Phase Locked Loop) circuit consisting of the clock generation circuit and a deflection yoke 12. Constitutions of the elements 400, 100, 200 and 300 in the clock generation circuit will be sequentially described.

First, the input signal line 400 has one end connected to a flyback pulse output terminal 12OT which the external deflection yoke 12 has and the other end connected to an input terminal IN shared by the first PLL circuit 100 and the delay circuit 200, and moreover comprises a step-down transformer circuit 16 arranged between both terminals. The step-down transformer circuit 16 serves to lower the voltage of the high-voltage flyback pulse outputted from the deflection yoke 12 up to the level where a first phase comparator 1 discussed later can receive the pulse in terms of its characteristics. Accordingly, when the first phase comparator can directly receive the non-lowered flyback pulse outputted from the deflection yoke 12 in terms of its characteristics, the step-down transformer circuit 16 is not needed.

Further, the first PLL circuit 100 is constituted of (1) the first phase comparator (hereinafter, referred to simply as PC 1) comprising a first input terminal which corresponds to the input terminal IN and a second input terminal receiving the feedback signal VF, (2) a first low-pass filter (hereinafter, referred to simply as LPF 2) comprising an input terminal connected to an output terminal of the PC 1, (3) a first voltage controlled oscillator (hereinafter, referred to simply as VCO 3) comprising a control voltage terminal connected to an output terminal of the LPF 2 and (4) a first (1/N) variable divider (N is any positive integer) (hereinafter, referred to simply as (1/N) divider) 4 comprising an input terminal connected to an output terminal of the VCO 3 and an output terminal connected to the second input terminal of the PC 1. Furthermore, instead of the (1/N) divider 4, a (1/N) fixed divider may be used.

Further, the delay circuit 200 comprises the first input terminal IN connected to the other end of the input signal line 400 and a second input terminal connected to the output terminal of the VCO 3, and has a function of detecting an edge of the voltage-lowered flyback pulse (hereinafter, referred to simply as flyback pulse) VFB and outputting a flyback delay signal VFBD which is delayed from the edge by a predetermined delay time. The predetermined delay time corresponds to the amount of horizontal movement on a screen of the CRT 13. Then, the delay circuit 200 consists of two circuit portions 5 and 6. Specifically, a rising edge detecting unit 5 has a first input terminal connected to the input terminal IN, a second input terminal connected to the output terminal of the VCO 3 and an output terminal. On the other hand, a digital delay unit 6 has a first input terminal connected to the output terminal of the rising edge detecting unit 5, a second input terminal connected to the output terminal of the VCO 3, a third input terminal receiving a signal giving the digital value (the digital value for horizontal position adjustment, the digital value for PIN balance correction or the digital value for KEY balance correction) generated by a CPU (not shown) and an output terminal. Furthermore, an exemplary constitution and an operation of the digital delay unit 6 will be discussed later in detail.

On the other hand, the second PLL circuit 300 comprises a first input terminal receiving the horizontal synchronizing signal VHSYNC, a second input terminal connected to the output terminal of the delay circuit 200 or the digital delay unit 6 and an output terminal connected to a horizontal drive pulse receiving terminal 12IT of the deflection yoke 12 through the output signal line 500. The constitution thereof will be described below in more detail. The second PLL circuit 300 comprises (1) a second phase comparator (hereinafter, referred to simply as PC) 7 comprising the first input terminal and the second input terminal of the second PLL circuit 300, (2) a second low-pass filter (hereinafter, referred to simply as LPF) 8 comprising an input terminal connected to an output terminal of the PC 7, (3) a second voltage controlled oscillator (hereinafter, referred to simply as VCO) 9 comprising a control voltage terminal connected to an output terminal of the LPF 8, (4) a second (1/N) variable divider (N is any positive integer) (hereinafter, referred to simply as (1/N) divider) 10 comprising an input terminal connected to an output terminal of the VCO 9 and (5) a horizontal drive pulse generation unit 11 comprising a first input terminal connected to an output terminal of the (1/N) divider 10 and a second input terminal connected to the output terminal of the VCO 9, which generates a horizontal drive pulse VHD and outputs the horizontal drive pulse VHD to the horizontal drive pulse receiving terminal 12IT through the output signal line 500. Further, instead of the (1/N) divider 10, a (1/N) fixed divider may be used.

The deflection yoke 12 has the same constitution as the deflection yoke 12P has. Accordingly, in a horizontal output circuit (not shown) which the deflection yoke 12 has, a flyback pulse of high energy is generated in a deflection coil (not shown) connected to a primary high-voltage winding of a flyback transformer (not shown) after a predetermined delay time passes from the input timing of the horizontal drive pulse VHD.

Next, an operation of the clock generation circuit having the above constitution will be discussed below.

First, an operation of the first PLL circuit 100 is as follows. Specifically, the PC 1 receives the flyback pulse VFB as a reference signal of the first PLL circuit 100 and compares the phases of the flyback pulse VFB and the other input signal VF. The LPF 2 on the next stage receives an output signal V1 of the PC 1 which gives the phase difference and smoothes the output signal V1 to generate an output signal V2 giving a control voltage. Further, the VCO 3 generates a first clock signal (hereinafter, referred to as clock) CLK1 having a frequency in accordance with the level of the output signal V2 and outputs the clock CLK1 to the (1/N) divider 4 and the delay circuit 200. The (1/N) divider 4 receives the clock CLK1, divides the frequency of the clock CLK1 into (1/N) and transmits the output signal to the PC 1 as the feedback signal VF. The PC 1 compares the phases of the feedback signal VF and the flyback pulse VFB serving as the reference signal again. Thus, the first PLL circuit 100 works with the flyback pulse VFB used as the reference signal, and the clock CLK1 in synchronization with the flyback pulse VFB is generated. As a result, the first PLL circuit 100 can quickly absorb the phase fluctuation of the flyback pulse VFB caused by various factors such as the ambient temperature and generate the stable clock CLK1 against the above factors.

Next, an operation of the delay circuit 200 will be discussed. First, the rising edge detecting unit 5 detects a rise timing or rising edge of the received flyback pulse VFB, using the flyback pulse VFB and the clock CLK1, and generates a first reset signal (hereinafter, referred to simply as reset signal) VRS1 which has the same pulse width as the clock CLK1 has and rises (or falls) in synchronization with the rise timing of the flyback pulse VFB to transmit the reset signal VRS1 to the digital delay unit 6. Accordingly, the rising edge detecting unit 5 can generate the reset signal VRS1 which rises (or falls) in response to the phase fluctuation of the flyback pulse VFB caused by various factors such as the ambient temperature.

On the other hand, the digital delay unit 6 generates the flyback delay signal VFBD which is delayed from the reset signal VRS1 by a predetermined delay time, using the clock CLK1. The predetermined delay time corresponds to the amount of horizontal movement on the screen. Specifically, the digital delay unit 6 starts a count operation of the clock CLK1 in response to the input timing (edge) of the reset signal VRS1 and generates the flyback delay signal VFBD to output the signal to the PC 7 as a compared signal at the point of time when the count value coincides with the digital value set in the digital delay unit 6 at that time. Thus, the digital delay unit 6 performs the same operation as that in the background art and generates the predetermined delay time in accordance with the digital value (the digital value for horizontal position adjustment, the digital value for PIN balance correction or the digital value for KEY balance correction) which is set in the digital delay unit 6.

Next, an operation of the second PLL circuit 300 will be discussed and a feedback operation of the circuits shown in FIG. 1 will be also discussed. First, the PC 7 receives the horizontal synchronizing signal VHSYNC as the reference signal of the second PLL circuit 300 and compares the phases of the horizontal synchronizing signal VHSYNC and the other input signal VFBD. The LPF 8 of the next stage receives an output signal V7 from the PC 7 and smoothes the signal V7 to generate an output signal V8 giving the control voltage. The VCO 9 performs an oscillation operation in accordance with the control voltage that the output signal V8 gives, to output a second clock signal (hereinafter, referred to as clock) CLK2. The (1/N) divider 10 divides the frequency of the received clock CLK2 into 1/N and transmits the divided clock to the horizontal drive pulse generation unit 11 as a second reset signal (hereinafter, referred to as reset signal) VRS2. The horizontal drive pulse generation unit 11 generates the horizontal drive pulse VHD, using the clock CLK2 and the reset signal VRS2, and drives the deflection yoke 12 with the horizontal drive pulse VHD.

The horizontal output circuit (not shown) of the deflection yoke 12 generates the above-discussed high-voltage flyback pulse after a predetermined delay time passes from the input timing (herein, rising edge) of the horizontal drive pulse VHD. The step-down transformer circuit 16 lowers the voltage of the generated flyback pulse and outputs the flyback pulse VFB to the PC 1 and the rising edge detecting unit 5.

The digital delay unit 6 operating on the basis of the clock CLK1 and the reset signal VRS1 which are generated with the flyback pulse VFB as reference generates the flyback delay signal VFBD having the predetermined delay time in accordance with the digital value set in the digital delay unit 6 at that stage and outputs the flyback delay signal VFBD to the PC 7. The PC 7 compares the phases of the horizontal synchronizing signal VHSYNC serving as the reference signal and the flyback delay signal VFBD. Thus, the second PLL circuit 300 works to generate the horizontal drive pulse VHD with the horizontal synchronizing signal VHSYNC used as the reference signal. Since the horizontal synchronizing signal VHSYNC serving as the reference signal of the PC 7 is stable and only the flyback delay signal VFBD varies its phase, the load on the second PLL circuit 300 is markedly reduced as compared with the background-art case where the phases of both the input signals vary and the clock CLK2 with sufficiently reduced jitter is obtained and as a result, the second PLL circuit 300 can generate the horizontal drive pulse VHD which is markedly stable.

Figures 2A, 2B, 2C, 2D:
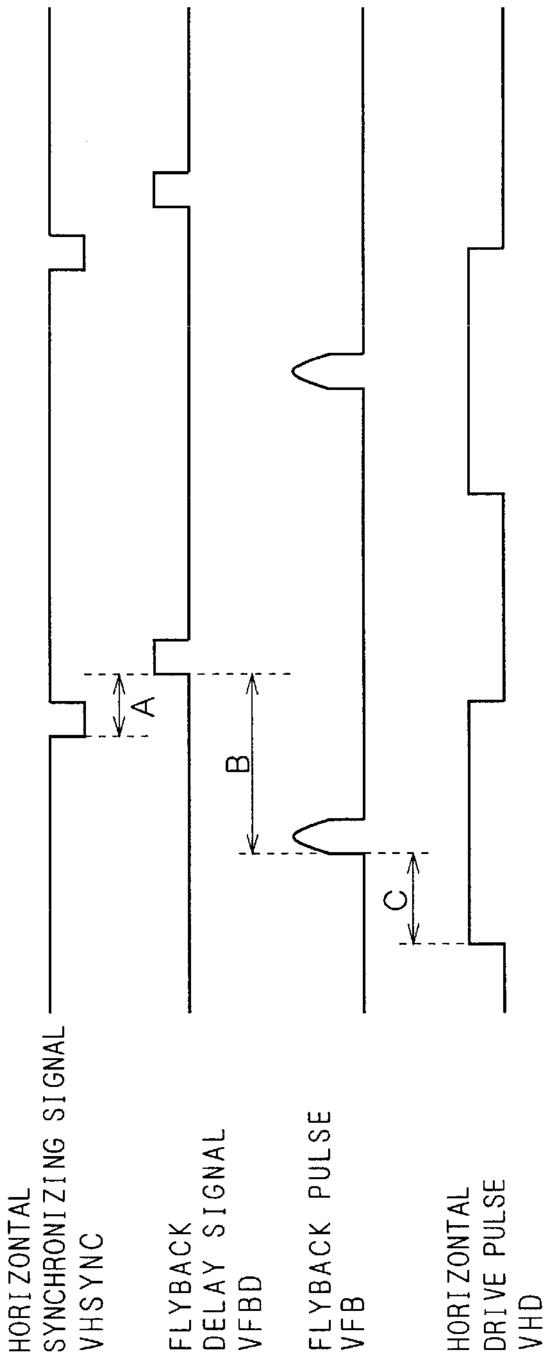
FIGS. 2A to 2D are timing charts showing an operation of the clock generation circuit in accordance with the first preferred embodiment of the present invention.

Next, FIGS. 2A to 2D are timing charts of the signals in the locked state or the steady state. FIG. 2A shows the horizontal synchronizing signal VHSYNC serving as the reference signal of the second PLL circuit 300. FIG. 2B shows the flyback delay signal VFBD which is the output signal of the digital delay unit 6. The second PLL circuit 300 in the steady state keeps a condition where the phase difference between the horizontal synchronizing signal VHSYNC of FIG. 2A and the flyback delay signal VFBD of FIG. 2B is a predetermined time A. A delay time B from the rise timing of the flyback pulse VFB of FIG. 2C to the rise timing of the flyback delay signal VFBD of FIG. 2B is generated by the digital delay unit 6. Specifically, the digital delay unit 6 generates the predetermined delay time B in accordance with the horizontal position adjustment, the PIN balance correction or the KEY balance correction to perform the horizontal position adjustment of screen or the distortion correction of screen. FIG. 2D shows the horizontal drive pulse VHD. The horizontal drive pulse VHD is a pulse whose duty ratio is almost 1:1 in one horizontal scanning period, and there is a delay time C between an edge (herein, rising edge) of the horizontal drive pulse VHD and a rising edge of the flyback pulse VFB of FIG. 2C. Though the delay time C is possibly changed, depending on various factors including the type of used monitor, the resolution, and the ambient temperature, the first PLL circuit 100 absorbs the above change of the delay time C more quickly and can perform a stable oscillation operation since the first PLL circuit 100 uses the flyback pulse VFB as its reference signal in the present device, and therefore it is possible to achieve a screen with no jitter.

A supplementary discussion will be made below on an exemplary circuit constitution and an operation of the digital delay unit 6.

Figure 3:
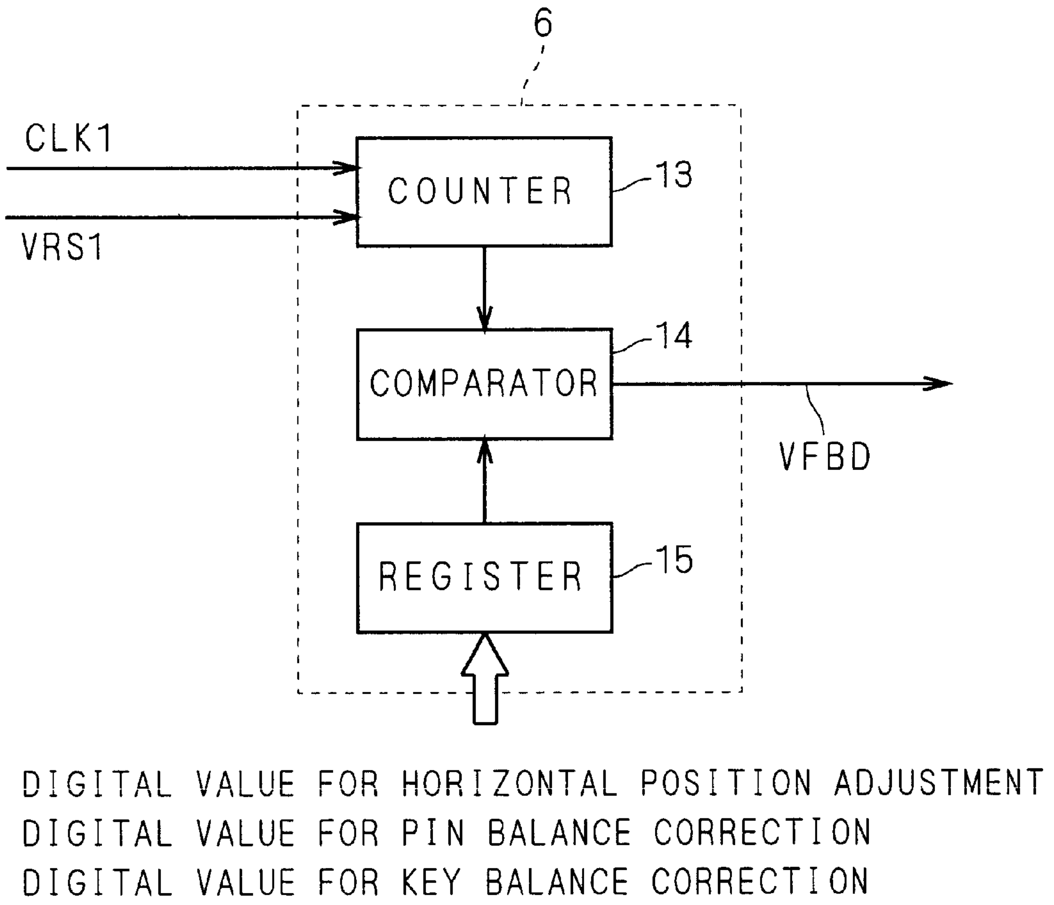
FIG. 3 is a block diagram showing a constitution of a digital delay unit.

FIG. 3 is a block diagram showing an exemplary circuit constitution of the digital delay unit 6. FIG. 3 shows a counter 13, a comparator 14 and a register 15.

As shown in FIG. 3, when the horizontal position adjustment is needed, the digital value for the horizontal position adjustment is set to the register 15. The counter 13 clears its value in accordance with the input timing of the reset signal VRS1 and thereafter performs a count-up operation of the clock CLK1. The comparator 14 compares the value of the counter 13 and the digital value for the horizontal position adjustment set in the register 15 and outputs a coincidence signal when both the values coincide with each other. The coincidence signal serves as the flyback delay signal VFBD which rises after the delay time B passes from the rise timing of the flyback pulse VFB. In this example, when the horizontal position adjustment is performed, the delay time B becomes longer and a positional change on a horizontal screen becomes larger as the register value increases.

After adjustment of the horizontal position, when the PIN balance correction or the KEY balance correction is needed, the digital value for the PIN balance correction or the digital value for the KEY balance correction is set to the register 15. In this case, it is possible to appropriately perform the PIN balance correction or the KEY balance correction by gradually changing the value to be set to the register 15 at every horizontal scanning cycle.

Figure 4:
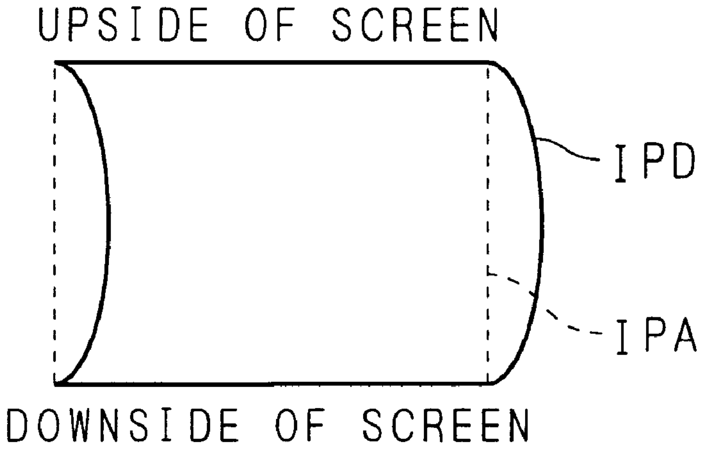
FIG. 4 is a view showing a screen before and after a PIN balance correction.
Figure 5:
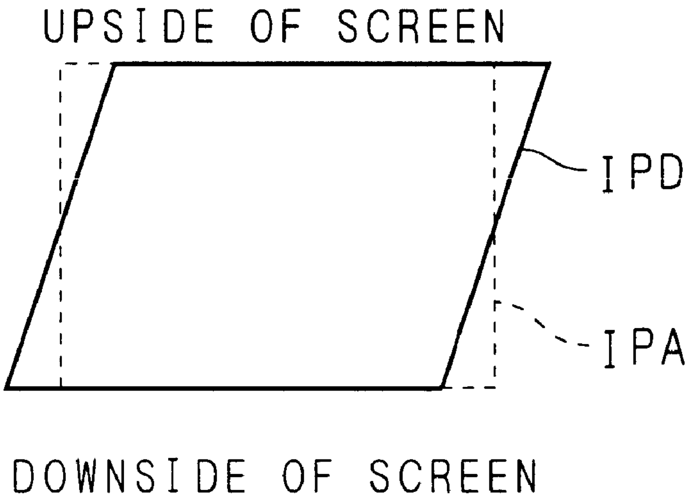
FIG. 5 is a view showing a screen before and after a KEY balance correction.

FIG. 4 is a view showing an example of the PIN balance correction and FIG. 5 is a view showing an example of the KEY balance correction. In FIGS. 4 and 5, the solid line IPD represents a distorted screen before the correction and the broken line IPA represents a corrected screen.

While the invention has been shown and described in detail, the foregoing description is in all aspects illustrative and not restrictive. It is therefore understood that numerous modifications and variations can be devised without departing from the scope of the invention.

What is claimed is:

1. A clock generation circuit comprising:

an input signal line comprising one end connected to a flyback pulse output terminal which an external deflection yoke has; and a phase locked loop circuit comprising an input terminal connected to the other end of said input signal line, wherein said phase locked loop circuit comprises:

a phase comparator comprising a first input terminal which corresponds to said input terminal and a second input terminal receiving a feedback signal;

a low-pass filter comprising an input terminal connected to an output terminal of said phase comparator;

a voltage controlled oscillator comprising a control voltage terminal connected to an output terminal of said low-pass filter; and a divider comprising an input terminal that is directly connected to an output terminal of said voltage controlled oscillator and an output terminal connected to said second input terminal of said phase comparator.

2. A clock generation circuit comprising:

an input signal line comprising one end connected to a flyback pulse output terminal of an external deflection yoke; and a phase locked loop circuit comprising an input terminal connected to the other end of said input signal line, wherein said locked loop circuit comprises:

a phase comparator comprising a first input terminal which corresponds to said input terminal and a second input terminal receiving a feedback signal;

a low-pass filter comprising an input terminal connected to an output terminal of said phase comparator;

a voltage controlled oscillator comprising a control voltage terminal connected to an output terminal of said low-pass filter;

a divider comprising an input terminal connected to an output terminal of said voltage controlled oscillator and an output terminal connected to said second input terminal of said phase comparator; and a delay circuit comprising a first input terminal connected to said other end of said input signal line and a second input terminal connected to said output terminal of said voltage controlled oscillator, said delay circuit detecting an edge of a flyback pulse and outputting a flyback delay signal which is delayed from said edge by a predetermined delay time, wherein said predetermined delay time corresponds to the amount of horizontal movement on a screen of a cathode ray tube comprising said deflection yoke.

3. The clock generation circuit according to claim 2, wherein said phase locked loop circuit, said phase comparator, said low-pass filter, said voltage controlled oscillator and said divider are defined as first phase locked loop circuit, a first phase comparator, a first low-pass filter, a first voltage controlled oscillator and a first divider, wherein said clock generation circuit further comprises:

a second phase locked loop circuit comprising a first input terminal receiving a horizontal synchronizing signal, a second input terminal connected to an output terminal of said delay circuit and an output terminal connected to a horizontal drive pulse receiving terminal of said deflection yoke, wherein said second phase locked loop circuit comprises:

a second phase comparator comprising said first input terminal and said second input terminal of said second phase locked loop circuit;

a second low-pass filter comprising an input terminal connected to an output terminal of said second phase comparator;

a second voltage controlled oscillator comprising a control voltage terminal connected to an output terminal of said second low-pass filter;

a second divider comprising an input terminal connected to an output terminal of said second voltage controlled oscillator; and a horizontal drive pulse generation unit comprising a first input terminal connected to an output terminal of said second divider and a second input terminal connected to said output terminal of said second voltage controlled oscillator, said horizontal drive pulse generation unit generating a horizontal drive pulse and outputting said horizontal drive pulse from said output terminal of said second phase locked loop circuit.

4. The clock generation circuit according to claim 3, wherein said input signal line comprises a step-down transformer circuit.

5. An image display device comprising:

the clock generation circuit as defined in claim 3; and a cathode ray tube, wherein said cathode ray tube comprises a deflection yoke comprising a flyback pulse output terminal connected to said one end of said input signal line and a horizontal drive pulse receiving terminal connected to said output terminal of said second phase locked loop circuit.

6. A clock generation circuit comprising:

input means for transmitting a flyback pulse supplied from an external deflection yoke; and first phase locked loop means for receiving said flyback pulse from said input means as a first reference signal, and for generating a first clock signal in synchronization with said flyback pulse;

delay means for receiving said flyback pulse and said first clock signal from said input means and said first phase locked loop means, respectively, and for detecting an edge of said flyback pulse and generating a flyback delay signal which is delayed from said edge by a predetermined delay time, wherein said predetermined delay time corresponds to the amount of horizontal movement on a screen of a cathode ray tube comprising said deflect on yoke.

7. The clock generation circuit according to claim 6, further comprising:

second phase locked loop means for receiving a horizontal synchronizing signal an said flyback delay signal as a second reference signal and a compared signal, respectively, and for generating a horizontal drive pulse, wherein said second phase locked loop means comprises phase comparator means for comparing a phase of said horizontal synchronizing signal and a phase of said flyback delay signal to generate a phase difference signal giving a phase difference between said horizontal synchronizing signal and said flyback delay signal;

low-pass filter means for smoothing said phase difference signal to output a smoothed signal;

voltage controlled oscillator means for receiving said smoothed signal as a control signal, and for performing an oscillation operation in accordance with said control signal to generate a second clock signal;

divider means for dividing a frequency of said second clock signal to generate a reset signal whose frequency is 1/N of said frequency of said second clock signal; and horizontal drive pulse generation means for generating said horizontal drive pulse or said deflection yoke on the basis of said second clock signal and said reset signal.

8. The clock generation circuit according to claim 7, wherein said input signal means comprises step-down transformer means for lowering a voltage of a high-voltage flyback pulse outputted from said deflection yoke to generate said flyback pulse.

9. An image display device comprising:

the clock generation circuit as defined in claim 8; and a cathode ray tube, wherein said cathode ray tube comprises a deflection yoke comprising a flyback pulse output terminal connected to an input terminal of said step-down transformer means and a horizontal drive pulse receiving terminal connected to an output terminal of said horizontal drive pulse generation means.

10. The clock generation circuit according to claim 1, wherein said divider is a 1/N divider, where N is a positive integer.

11. The clock generation circuit according to claim 1, wherein said output terminal of said divider is directly connected to said second input terminal of said phase comparator.

12. The clock generation circuit according to claim 3, wherein said first divider is a first 1/N divider, where N is a positive integer.

13. The clock generation circuit according to claim 3, wherein said second divider is a second 1/N divider, where N is a positive integer.

14. The clock generation circuit of claim 1, wherein the output terminal of the voltage controlled oscillator is also directly connected with a delay circuit.

15. The clock generation circuit of claim 1, wherein the input signal line is connected with the output terminal of an external deflection yoke via a step-down transformer circuit.

16. The clock generation circuit of claim 15, wherein the input signal line is directly connected with the step-down transformer circuit, and wherein the step-down transformer circuit is directly connected with the flyback output terminal of the external deflection yoke.

* * * * *